United States Patent
Yonge, III et al.

(10) Patent No.: US 8,483,313 B2
(45) Date of Patent: Jul. 9, 2013

(54) TRANSMISSION SUPPRESSION

(75) Inventors: Lawrence W. Yonge, III, Ocala, FL (US); Arun Avudainayagam, Gainsville, FL (US); Timothy J. Vandermey, Altamonte Springs, FL (US)

(73) Assignee: QUALCOMM Incorporated, San Diego, CA (US)

( * ) Notice: Subject to any disclaimer, the term of this patent is extended or adjusted under 35 U.S.C. 154(b) by 765 days.

(21) Appl. No.: 12/617,032

(22) Filed: Nov. 12, 2009

(65) Prior Publication Data
US 2010/0124289 A1 May 20, 2010

Related U.S. Application Data

(60) Provisional application No. 61/114,845, filed on Nov. 14, 2008.

(51) Int. Cl.
*H04K 1/02* (2006.01)

(52) U.S. Cl.
USPC .......................... 375/296; 375/232; 375/350

(58) Field of Classification Search
USPC ......................................... 375/257, 232, 219
See application file for complete search history.

(56) References Cited

U.S. PATENT DOCUMENTS

| | | | |
|---|---|---|---|
| 5,317,596 A | 5/1994 | Ho et al. | |
| 6,147,979 A | 11/2000 | Michel et al. | |
| 6,801,086 B1 | 10/2004 | Chandrasekaran | |
| 6,956,433 B2 | 10/2005 | Kim et al. | |
| 7,027,592 B1 | 4/2006 | Straussnigg et al. | |
| 2001/0043650 A1* | 11/2001 | Sommer et al. | 375/232 |
| 2005/0094718 A1 | 5/2005 | Pastemak et al. | |
| 2005/0186933 A1 | 8/2005 | Trans | |
| 2005/0285974 A1* | 12/2005 | Kim | 348/448 |
| 2012/0163443 A1* | 6/2012 | Cookman et al. | 375/232 |

OTHER PUBLICATIONS

International Search Report & Written Opinion issued in PCT application No. PCT/US09/64134, dated Jan. 12, 2010, 12 pages.

* cited by examiner

*Primary Examiner* — Eva Puente
(74) *Attorney, Agent, or Firm* — DeLizio Gilliam, PLLC

(57) ABSTRACT

A transmission suppression apparatus includes a first modulator that converts a symbol to a waveform. The apparatus further includes a first non-linear filter, configured to at least partially compensate for non-linear distortions of a transmission signal path. The apparatus further includes a first medium coupling device for coupling signals to a communication medium. The apparatus further includes a second medium coupling device for coupling signals from the communication medium. The apparatus further includes summing circuitry with a first input connected to an output of the second medium coupling device. The apparatus further includes cancellation circuitry, connected to a second input of the summing circuit, that converts the symbol to an analog waveform that is substantially 180 degrees out of phase with the analog waveform encoding the symbol on the first input to the summing circuit.

75 Claims, 8 Drawing Sheets

TRANSMISSION SUPPRESSION

CROSS-REFERENCE TO RELATED APPLICATIONS

This application claims priority to U.S. Application Ser. No. 61/114,845, filed on Nov. 14, 2008, which is incorporated herein by reference.

TECHNICAL FIELD

This patent application relates generally to full-duplex digital communication, communication signal repeaters, and power line communications.

BACKGROUND

In some cases it is desirable to have uninterrupted two-way communication between two devices. For example, telephone calls typically allow uninterrupted two-way communication to simulate a face-to-face communication. Two-way communication can be achieved by dedicating separate communication media to signals in each direction. In some circumstances using separate media can be expensive or impossible. Full-duplex communications allow two devices to both send and receive signals at the same time on a single communication medium. The problem that arises when the devices transmit and receive simultaneously on a communication medium is that the transmitted signal may interfere with the received signal and prevent accurate reception. One way to achieve full-duplex communications is to allocate different frequency bands to each direction of transmission. Confining the transmissions in each direction to non-overlapping frequency bands prevents the signals from interfering with one another. Band-pass filters may be used to cleanly receive each signal while alternate direction transmission continues. This approach may have some draw-backs in certain circumstances, such as reducing the usable bandwidth on the medium available for transmissions in each direction and thus limiting the rate of data transfer.

Communications signal repeaters are devices used to relay signals between communication nodes that may share access to communication medium, but are still unable to communicate directly with each other because, for example, one node is out of range to reliably receive transmissions from another node. For example, repeaters are often employed in Power Line Communications (PLC) networks. Due to limited bandwidth (e.g., 2-80 MHz) and regulatory limits on radio frequency emissions, digital transmissions over power lines have limited range, typically 1-2 km. In order to propagate signals over longer distances on a power line, digital repeaters are mounted on pole tops at distances corresponding to the range limitations of the power line. Reaching customers located at the extreme end of a power line can require as many as 25 hops between repeaters.

Transmissions requiring several hops can incur significant delay and consume a relatively large amount of available bandwidth because each retransmission of a signal occupies bandwidth on the communication medium. PLC devices typically share the medium via a Carrier Sense Multiple Access—Collision Avoidance (CSMA-CA) mechanism. This is essentially a listen-before-talk scheme. If the medium is busy, a station will wait until the medium is idle before sending any queued data. Transmissions on a CSMA-CA network are broken up into units of limited duration called frames. When a station has data to transmit and detects the medium is idle it will contend for the medium by commencing the transmission of a frame. If no collision occurs, the station will complete transmission of the frame. Upon completion of the frame, the station will relinquish the medium for at least a predetermined period of time to allow other stations to contend for the medium with transmissions of appropriate priority level. After the period of time expires, the station may commence transmission of another frame as needed. Repeaters must contend for the medium in order to retransmit a frame of data that they have received. Repeaters receive one or more complete frames of data and store that data until the repeater is able to successfully contend for the medium and commence retransmission of the data in a new frame or frames. This store and forward method causes an additional delay of at least the frame duration for each repeater hop in the path of a message. Each retransmission along the path also occupies bandwidth on the medium for the entire duration of the frame or frames.

SUMMARY

In one aspect, in general, an apparatus includes a first modulator that converts a symbol to a waveform. The apparatus further includes a first non-linear filter, configured to at least partially compensate for non-linear distortions of a transmission signal path. The apparatus further includes a first medium coupling device for coupling signals to a communication medium. The apparatus further includes a second medium coupling device for coupling signals from the communication medium. The apparatus further includes summing circuitry with a first input connected to an output of the second medium coupling device. The apparatus further includes cancellation circuitry, connected to a second input of the summing circuit, that converts the symbol to an analog waveform that is substantially 180 degrees out of phase with the analog waveform encoding the symbol on the first input to the summing circuit.

Aspects can include one or more of the following features. The first non-linear filter may be cascaded after the first modulator and the first medium coupling device may be cascaded after the first non-linear filter. The waveform may be a digitally encoded waveform. The apparatus may further include a first digital to analog converter cascaded after the first non-linear filter. The apparatus may further include a first analog amplifier connected to the output of the first digital to analog converter. The apparatus may further include a second analog amplifier with an automatic gain control circuit with the input connected to the output of the summing circuit. The apparatus may further include an analog to digital converter connected to the output of the second analog amplifier, a digital filter that converts the symbol to a digitally encoded waveform that is substantially 180 degrees out of phase with a residual signal encoding the symbol on the output of the analog to digital converter, and a digital summer that adds the output of the digital filter to the output of the analog to digital converter. The cancellation circuitry may include a second non-linear filter configured to at least partially pre-compensate for non-linear distortions of the cancellation circuitry. The first non-linear filter may be a memory polynomial filter. The communication medium may be a power line. The first non-linear filter may have a plurality of sets of coefficients, wherein each set of coefficients is associated with a different phase of the power cycle on the power line and each set of coefficients is adapted independently of the other sets of coefficients. The first modulator may be an orthogonal frequency division multiplexing modulator. The apparatus may further include a second analog amplifier connected to the output of the summing circuit, an analog to digital converter connected to the output of the second analog amplifier, and a signal path estimation block configured to estimate the non-linear distortion in the transmission signal path and the linear distortion in the transmission signal path based on the signal at the output of the analog to digital converter and the symbol. The signal path estimation block may be configured to estimate the linear distortion first and use the linear distortion estimate to estimate the non-linear distortion. The non-linear distortion estimate from the signal path estimation block may be used to configure the first non-linear filter and the estimation process is repeated with a subsequent symbol. The first medium coupling device and the second medium coupling device may share one or more common components.

In another aspect, in general, a method includes filtering a transmission signal with a non-linear filter to at least partially pre-compensate for nonlinear distortion in a first signal path to generate a pre-compensated transmission signal. The method further includes coupling the pre-compensated transmission signal to a communication medium. The method further includes receiving, at a co-located receiver, an analog received signal from the communication medium that includes a component caused by the transmission signal. The method further includes filtering the transmission signal to generate an analog cancellation signal that is substantially 180 degrees out of phase with the component of the analog received signal that is caused by the transmission signal. The method further includes adding the analog cancellation signal to the analog received signal.

Aspects can include one or more of the following features. The non-linear filter may be a digital filter. The method may further include converting the pre-compensated transmission signal to an analog transmission signal. The method may further include converting the received signal resulting from analog cancellation to a digital received signal, filtering the transmission signal to output a digital cancellation signal that is substantially 180 degrees out of phase with a residual component of the digital received signal that is caused by the transmission signal, and adding the digital cancellation signal to the digital received signal. Filtering the transmission signal to generate an analog cancellation signal may include filtering with a non-linear filter configured to substantially pre-compensate for non-linear distortions of a cancellation path. The non-linear filter may be a memory polynomial filter. The communication medium may be a power line. The transmission signal may be an orthogonal frequency division multiplexing signal. The communication medium may be a coaxial cable. The communication medium may be a twisted pair cable. An estimate of an impulse response of a signal path including the communication medium may be used to filter the transmission signal to generate an analog cancellation signal.

In another aspect, in general, a method includes transmitting a plurality of orthogonal frequency division multiplexing symbols on a communication medium. The method further includes receiving the symbols from the communication medium at a co-located receiver. The method further includes applying a discrete Fourier transform to each of the received symbols to compute the frequency domain representation of the received symbols. The method further includes dividing the frequency domain representation of each of the received symbols by the frequency domain representation of the corresponding transmitted symbol. The method further includes averaging the quotients over all the symbols to estimate a transfer function of a first signal path. The method further includes dividing the frequency domain representation of each of the received symbols by the transfer function estimate and applying an inverse discrete Fourier transform to produce linear distortion compensated received symbols. The method further includes estimating the non-linear distortion in the first signal path based on the transmitted symbols and the linear distortion compensated received symbols.

Aspects can include one or more of the following features. The method may further include configuring a non-linear filter to pre-compensate for non-linear distortions in the first signal path based on the estimate of the non-linear distortion in the first signal path, applying the non-linear filter to a plurality of orthogonal frequency division multiplexing symbols, and iterating the path estimation process, using the pre-compensated symbols to estimate the linear distortion of the signal path. The method may further include calculating the change in the linear and non-linear channel estimates from the last iteration and continuing to iterate until the change in the linear and non-linear channel estimates is below a threshold, at which point the linear and non-linear channel estimates are stored. The non-linear distortion on the first signal path may be modeled as a memory polynomial for estimation. The coefficient estimates for the memory polynomial may be calculated using a gradient descent algorithm. The gradient descent algorithm may use different adaptation step sizes for each harmonic branch of the memory polynomial. The gradient descent algorithm may use smaller step sizes for higher harmonic branches of the memory polynomial. The method may further include passing a plurality of orthogonal frequency division multiplexing symbols through a second signal path that includes a cancellation path to an analog summer in the co-located receiver and iterating the estimation process to estimate the linear and non-linear distortions in the second signal path.

In another aspect, in general, a method includes transmitting a first multi-carrier signal on a communication medium and recovering a second multi-carrier signal from the communication medium, wherein the first multi-carrier signal and the second multi-carrier signal at least partially overlap in both frequency and time. Recovering the second multi-carrier signal includes adding a cancellation signal to a signal detected from the medium to suppress the first multi-carrier signal and recover the second multi-carrier signal.

Aspects can include one or more of the following features. Recovering the second multi-carrier signal may include calculating the cancellation signal to be substantially 180 degrees out of phase with the component of the signal detected from the medium that is caused by the first multi-carrier signal. The communication medium may be a power line. The communication medium may be a coaxial cable. The communication medium may be a twisted pair cable. An estimate of an impulse response of a signal path including the communication medium may be used to filter the transmission signal to generate an analog cancellation signal. The first and second multi-carrier signals may be orthogonal frequency division multiplexed signals. The set of carrier frequencies modulated by data in the first multi-carrier signal and the set of carrier frequencies modulated by data in the second multi-carrier signal may intersect. The first multi-carrier signal and the second multi-carrier signal may be synchronized. Symbol boundaries of the first multi-carrier signal and the second multi-carrier signal may be aligned in time at the receiver. The first multi-carrier signal and the second multi-carrier signal may be synchronized so that symbol boundaries are aligned in time at the receiver. The multi-carrier signals may be broadband signals. The first multi-carrier signal may encode data from a frame that is still being received from the second multi-carrier signal.

In another aspect, in general, an apparatus includes a modulator that converts a symbol to a digitally encoded waveform. The apparatus further includes a non-linear filter, configured to substantially pre-compensate for non-linear distortions of a transmission signal path, cascaded after the modulator. The apparatus further includes a digital to analog converter cascaded after the non-linear filter. The apparatus further includes an analog amplifier connected to the output of the digital to analog converter. The apparatus further includes a medium coupling device connected to the output of the analog amplifier. The apparatus further includes a receiver connected to the medium coupling device, receiving a detected signal appearing on a medium connected to the medium coupling device. The apparatus further includes a cancellation device that substantially cancels the representation of the symbol in the detected signal to determine a cancelled signal. The apparatus further includes an adaptation block that calculates new values for coefficients of the non-linear filter based in part on the cancelled signal.

Aspects can include one or more of the following features. The cancellation device may include an analog summing circuit that is used to add a cancellation signal to the detected signal. The non-linear filter may be a memory polynomial filter. The medium coupling device may be connected to a power line and couple signals to and from the power line. The medium coupling device may be connected to a coaxial cable and couple signals to and from the coaxial cable. The medium coupling device may be connected to a twisted pair cable and couple signals to and from the twisted pair cable. The first non-linear filter may have a plurality of sets of coefficients, wherein each set of coefficients is associated with a different phase of the power cycle on the power line and each set of coefficients is adapted independently of the other sets of coefficients. The first modulator may be an orthogonal frequency division multiplexing modulator.

In another aspect, in general, an apparatus includes a transmitter configured to modulate a first multi-carrier signal and couple the first multi-carrier signal to a communication medium. The apparatus further includes a receiver configured to couple signals from the communication medium and demodulate a second multi-carrier signal, wherein the first multi-carrier signal and the second multi-carrier signal at least partially overlap in both frequency and time. The apparatus further includes a processing device connected to both the transmitter and the receiver and configured to calculate a cancellation signal and add the cancellation signal to signals coupled from the communication medium by the receiver to suppress the first multi-carrier signal and recover the second multi-carrier signal.

Aspects can include one or more of the following features. The cancellation signal may be substantially 180 degrees out of phase with the component of the signals coupled from the communication medium that is caused by the first multi-carrier signal. The communication medium may be a power line. The communication medium may be a coaxial cable. The communication medium may be a twisted pair cable. The processing device may calculate an estimate of an impulse response of a signal path including the communication medium that is used to filter the transmission signal to generate the cancellation signal. The cancellation signal may be analog and the receiver may include an analog summer circuit that is used to add the cancellation signal to signals coupled from the communication medium. The first and second multi-carrier signals may be orthogonal frequency division multiplexed signals. The set of carrier frequencies modulated by data in the first multi-carrier signal and the set of carrier frequencies modulated by data in the second multi-carrier signal may intersect. The first multi-carrier signal and the second multi-carrier signal may be synchronized. Symbol boundaries of the first multi-carrier signal and the second multi-carrier signal may be aligned in time at the receiver. The first multi-carrier signal and the second multi-carrier signal may be synchronized so that symbol boundaries are aligned in time at the receiver. The multi-carrier signals may be broadband signals. The transmitter may include a non-linear filter, configured to at least partially compensate for non-linear distortions of a transmission signal path. The non-linear filter may include coefficients that are calculated by the processing device based at least in part on signals coupled from the communication medium by the receiver. The processing device may calculate a second cancellation signal that is digital, the receiver may further include an analog to digital converter connected to the output of the analog summer circuit, and the second cancellation signal may be added to digital signals from the analog to digital converter. The second cancellation signal may be substantially 180 degrees out of phase with a residual component of the signals coupled from the communication medium that is caused by the first multi-carrier signal that remains after addition of the analog cancellation signal. The first multi-carrier signal may encode data from a frame that has been partially demodulated and is still being demodulated by the receiver from the second multi-carrier signal.

In another aspect, in general, an apparatus includes a means for transmitting a first multi-carrier signal on a communication medium. The apparatus further includes a means for recovering a second multi-carrier signal from the communication medium, wherein the first multi-carrier signal and the second multi-carrier signal at least partially overlap in both frequency and time. Recovering the second multi-carrier signal includes adding a cancellation signal to a signal detected from the medium to suppress the first multi-carrier signal and recover the second multi-carrier signal.

Among the many advantages of the invention (some of which may be achieved only in some of its various aspects and implementations) are the following.

Transmission signals from a transmitter that are detected by a collocated receiver can be suppressed to enable simultaneous transmission and reception of signals on a communication medium while reusing bandwidth for both transmission and reception. For example, the described methods and apparatus may be applied in a full-duplex orthogonal frequency division multiplexed (OFDM) communications system with upstream and downstream signals simultaneously occupying some or all of the same frequency spectrum. In another example, the described methods and apparatus may be applied in a communications signal repeater to reduce delay through a network without reducing throughput by allowing the repeater to begin the forwarding transmission of a frame of data before reception of the entire frame is completed, while reusing some or all of the same frequency spectrum on the communication medium. Furthermore, some of the methods and apparatus described in this application provide for effective local transmit cancellation in the presence of transmit amplifiers and transmission channels that have both linear and non-linear distortion components.

The transmit signal is pre-compensated for non-linear distortion such that the signal, when it reaches the communication medium, is cleaner in the sense that the non-linear distortions of the transmit amplifier are mitigated. By adding a cancellation waveform to the received waveform in the analog domain, the signal-to-noise ratio at the digital receiver is improved and the requisite dynamic range or required bits of the analog-to-digital converter are reduced. Estimating the linear distortion effects independently from the non-linear distortion effects, yields a highly computationally efficient cancellation model. The system allows for robust full duplex communication on a network with large distortions, attenuations and reflections that result in a reflected version of the transmit signal with power that is large relative to signal received from a remote transmitter.

Some of the foregoing method(s) may be implemented as a computer program product comprised of instructions that are stored on one or more machine-readable media, and that are executable on one or more processing devices. The foregoing method(s) may be implemented as an apparatus or system that includes one or more processing devices and memory to store executable instructions to implement the method.

The details of one or more examples are set forth in the accompanying drawings and the description below. Further features, aspects, and advantages of the invention will become apparent from the description, the drawings, and the claims.

DESCRIPTION OF THE DRAWINGS

Like reference numerals in different figures indicate like elements.

DETAILED DESCRIPTION

Figure 1:
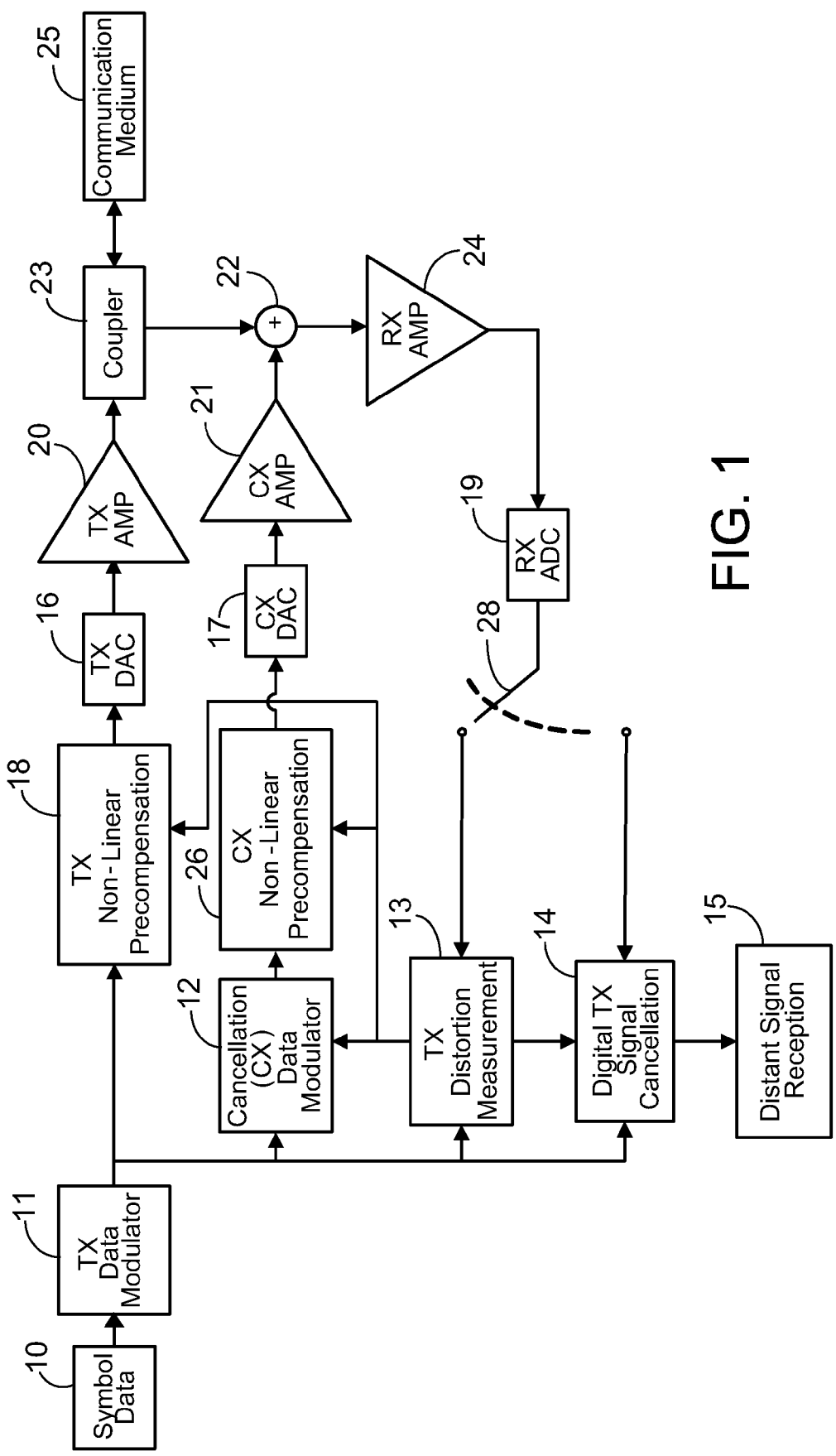
FIG. 1 is a block diagram of a digital communication transceiver employing transmission suppression.

There are a great many possible implementations of the invention, too many to describe herein. Some possible implementations that are presently preferred are described below. It cannot be emphasized too strongly, however, that these are descriptions of implementations of the invention, and not descriptions of the invention, which is not limited to the detailed implementations described in this section but is described in broader terms in the claims.

Cancellation techniques are used to achieve full-duplex communication or low-delay forwarding on a communication medium while allowing the transmitted and received signals to overlap in both time and frequency. When the transmitted signal is coupled to the medium, it is detected by a collocated receiver along with a desired signal from a remote device. A cancellation signal is generated based upon information about the transmitted signal and the signal paths. The cancellation signal is added to the detected signal to substantially suppress or eliminate the components associated with the transmitted signal and facilitate reception of the desired signal. The cancellation signal may be generated by applying adaptive linear and/or non-linear filters to a representation of the transmitted signal.

Non-linearities in the transmit signal path may be pre-compensated using a adaptive non-linear filter in the transmit path, thus simplifying the adaptation of the filters in the cancellation signal path. The non-linear pre-compensation filter may be adapted based on measurements of the detected signal, possibly after processing to remove linear distortions from the signal. The use of a non-linear pre-compensation filtering in the transmit path has the additional benefit of providing a cleaner transmitted signal on the medium, thus facilitating remote reception and regulatory compliance.

Some or all of the cancellation may be performed on the analog detected signal by using an analog summing circuit to apply an analog cancellation signal to the detected signal prior to analog to digital conversion. Applying a cancellation signal in the analog domain may allow the use of a digital to analog converter with a smaller dynamic range which is generally cheaper. This advantage is most pronounced when the power of the component of the detected signal corresponding to the transmitted signal is large relative to the power of the desired signal component. A digital cancellation signal may be applied to the received signal after analog to digital conversion to further suppress any residual components in the signal relating to the transmitted signal.

Some implementations of the physical (PHY) layer use OFDM modulation. In OFDM modulation, data are transmitted in the form of OFDM "symbols." Each symbol has a predetermined time duration or symbol time $T_s$. Each symbol is generated from a superposition of N sinusoidal carrier waveforms that are orthogonal to each other and form the OFDM carriers. Each carrier has a center (or "peak") frequency $f_i$ and a phase $\Phi_i$ measured from the beginning of the symbol. For each of these mutually orthogonal carriers, a whole number of periods of the sinusoidal waveform is contained within the symbol time $T_s$. The symbol time $T_s$ does not include added time between symbols for features of a transmission protocol such as a guard band or cyclic prefix. Equivalently, each carrier frequency is an integral multiple of a frequency interval $\Delta f=1/T_s$. The phases $\Phi_i$ and amplitudes $A_i$ of the carrier waveforms can be independently selected (according to an appropriate modulation scheme) without affecting the orthogonality of the resulting modulated waveforms. The carriers occupy a frequency range between frequencies $f_1$ and $f_N$ referred to as the OFDM bandwidth.

FIG. 1 depicts an exemplary transmit cancellation system where OFDM symbol data 10, generated by a micro controller or other such data source, is passed to the TX Data Modulator 11. The TX Data Modulator 11 digitally transforms the symbol data into a corresponding digitally represented spectrally encoded OFDM symbol. The TX Data Modulator 11 then converts this frequency domain symbol into a digitally encoded time domain symbol, and adds an appropriately sized guard interval to the time domain waveform. The digitally encoded time domain waveform data is then passed to the non-linear pre-compensation block 18 where the inverse of the nonlinearities of the system's transmit and receive signal propagation path H1 36 (FIG. 2), which has been measured by the TX Distortion Measurement block 13, are applied to the transmit waveform. The digitally represented pre-compensated time domain symbol waveform data is then passed to a digital-to-analog converter (DAC) 16 where it is translated into a time domain voltage waveform. This voltage waveform is then amplified in the transmit amplifier TX AMP 20 to an appropriate power level and coupled by the coupler 23 to the communication medium 25 where the waveform will be observable by all receivers within range, including the local receiver which is co-located with the transmitter blocks. The transmitted signal that enters the co-located receiver may cause interference with the reception of a signal from a distant transmitter. The cancellation system is able to suppress any such interference.

The waveform used to cancel the transmitted waveform as it appears at the receive summer 22 is also computed from the same OFDM symbol data 10 used by the TX Data Modulator 11. Much like the TX Data Modulator 11 the Cancellation (CX) Data Modulator 12 digitally transforms the symbol data into a corresponding digitally represented spectrally encoded OFDM symbol. This spectrally encoded symbol is then adjusted for the system's linear distortions by multiplying it's spectrally encoded representation by the spectral representation of the composite linear channel distortion computed by the TX Distortion Measurement block 13. This composite linear channel distortion is equal to the linear spectral distortion experienced by path H1 36 divided by the linear spectral distortion experienced by path H2 37. These distortions are measured by the TX Distortion Measurement block 13 and stored (e.g., in a memory within the block 13). After the spectrally encoded symbol has been compensated for the composite linear distortions of the system, it is transformed into the time domain, where the appropriate length guard interval is added to its time domain digital representation. Let h1 and h2 refer to the impulse response of the two paths H1 and H2 respectively. Let x refer to the spectrally encoded OFDM symbol in the time domain at the output of the TX Data Modulator 11. Then the spectrally-encoded cancellation OFDM symbol in the time-domain, $x_c$, is given by $$x_c = F_N^{-1}(F_N(x) * F_N(h1)/F_N(h1))$$

In the above equation, N represents the Fast Fourier Transform (FFT) size used in the OFDM system, and $F_N$ represents the N-point FFT operation. The inverse FFT ($F_N^{-1}$) operation above represents the N-point IFFT as defined by the system and could involve the conjugate symmetric extension of the argument.

Note that h1 and h2 or $F_N$(h1) and $F_N$(h2) may be computed and stored in the TX distortion measurement block 13.

Figure 3:
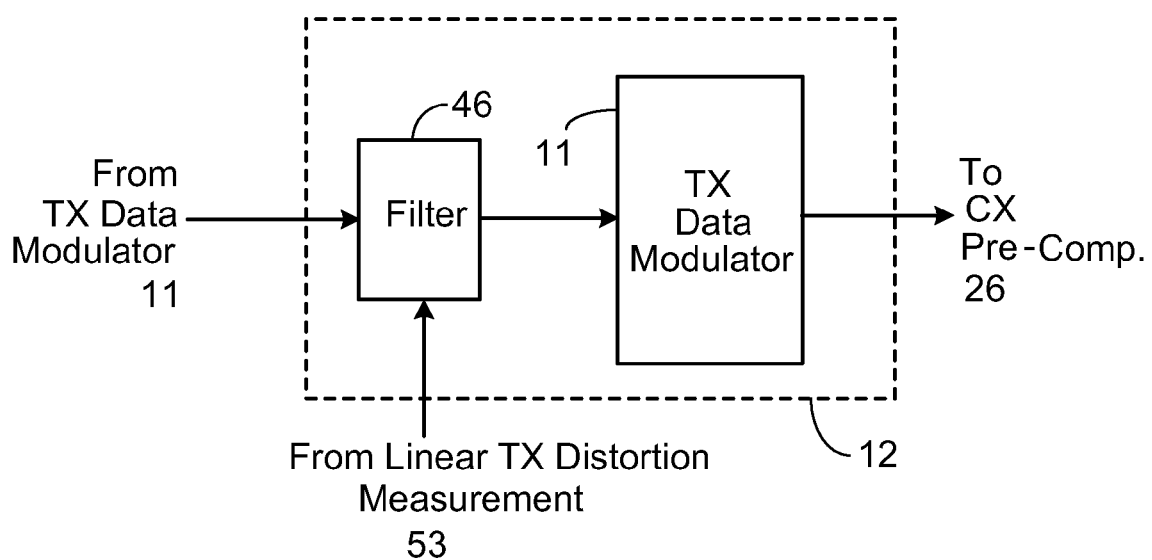
FIG. 3 is a block diagram of a data modulator used to generate an analog transmit-cancellation signal.

The time domain cancellation signal ($x_c$) in the above equation is then extended with a corresponding prefix for the guard interval. Thus, in essence, the CX data modulator filters the output of the TX data modulator 11 and performs the same operation as the TX data modulator on this filtered output. The described operation of the CX data modulator is depicted in FIG. 3. The filter 46 in FIG. 3 is described in the frequency domain in the above equation. The system may reuse hardware by sharing building blocks, such as FFT engines, in the various digital signal paths for a more cost effective and efficient implementation. Though FIG. 1 shows one embodiment where the CX data modulator 12 receives its input from the output of the TX data modulator 11, the CX data modulator could alternatively receive the input symbol data 10 directly in order to compute the cancellation signal.

The time domain signal at the output of the CX data modulator 12 is then pre-compensated for the nonlinearities experienced by path H2 37. These nonlinearities are measured by, and stored in, the TX Distortion Measurement 13 block and applied to the digitally represented time domain symbol by the CX Non-linear Pre-compensation 26 block. After the digitally represented time domain symbol has been fully compensated it is passed to the CX DAC 17 where it is translated into a corresponding analog voltage waveform. It should be noted that the time domain symbol transmitted from the CX DAC 17 is transmitted synchronously with the corresponding symbol which is transmitted from the TX DAC 16. The analog voltage waveform coming from the CX DAC 17 is then amplified by the CX AMP 21 which drives the analog summer 22. After the summing process, the signal leaving the analog summer 22 and driving the RX AMP 24 will contain all the signals found on the medium, with the exception of the all or part of the signals transmitted by the local transmitter (e.g., from any of the blocks 11, 18, 16, or 20) which have been cancelled out in the summation process. Any residual signals from the output of the TX AMP 20 that remain at the output of the RX AMP 24 will be removed in the Digital TX signal cancellation block 14.

In OFDM systems, the complexity of the transmission suppression system may be reduced by synchronizing the transmitted OFDM signal with the received OFDM signal to exploit the guard interval, or cyclic prefix. Synchronization allows the cancellation filtering to be performed on a symbol by symbol basis using cyclic convolution, instead of performing a more complex linear convolution on the sequence of OFDM symbols. When symbol by symbol cyclic convolution is used errors are created in the cancellation signal at the symbol boundaries due to the inaccuracy of the approximation of the transmitted signal as a periodic signal. These errors have a duration determined by the length of the impulse response of the channel estimate. In this case it is desirable to have a guard interval that is at least as long as the delay spread of the channel H1. When this condition on the guard interval is met and the symbols of the two OFDM signals are aligned at the receiver, the error in the cancellation signal occurs during the guard interval of the desired received signal, which is discarded by the receiver anyway. Thus, the cancellation approach described above exploits the guard interval in multicarrier systems to avoid cancellation at symbol boundaries, thereby greatly simplifying the cancellation process.

Measurement Process—Analog Cancellation Loop

In order for the aforementioned analog transmit power cancellation process to provide accurate cancellation, accurate linear and non-linear measurements of the transmit path H1 36 and the cancellation path H2 37 should be made and stored. This can be done, for example, in the following manner.

Figure 2:
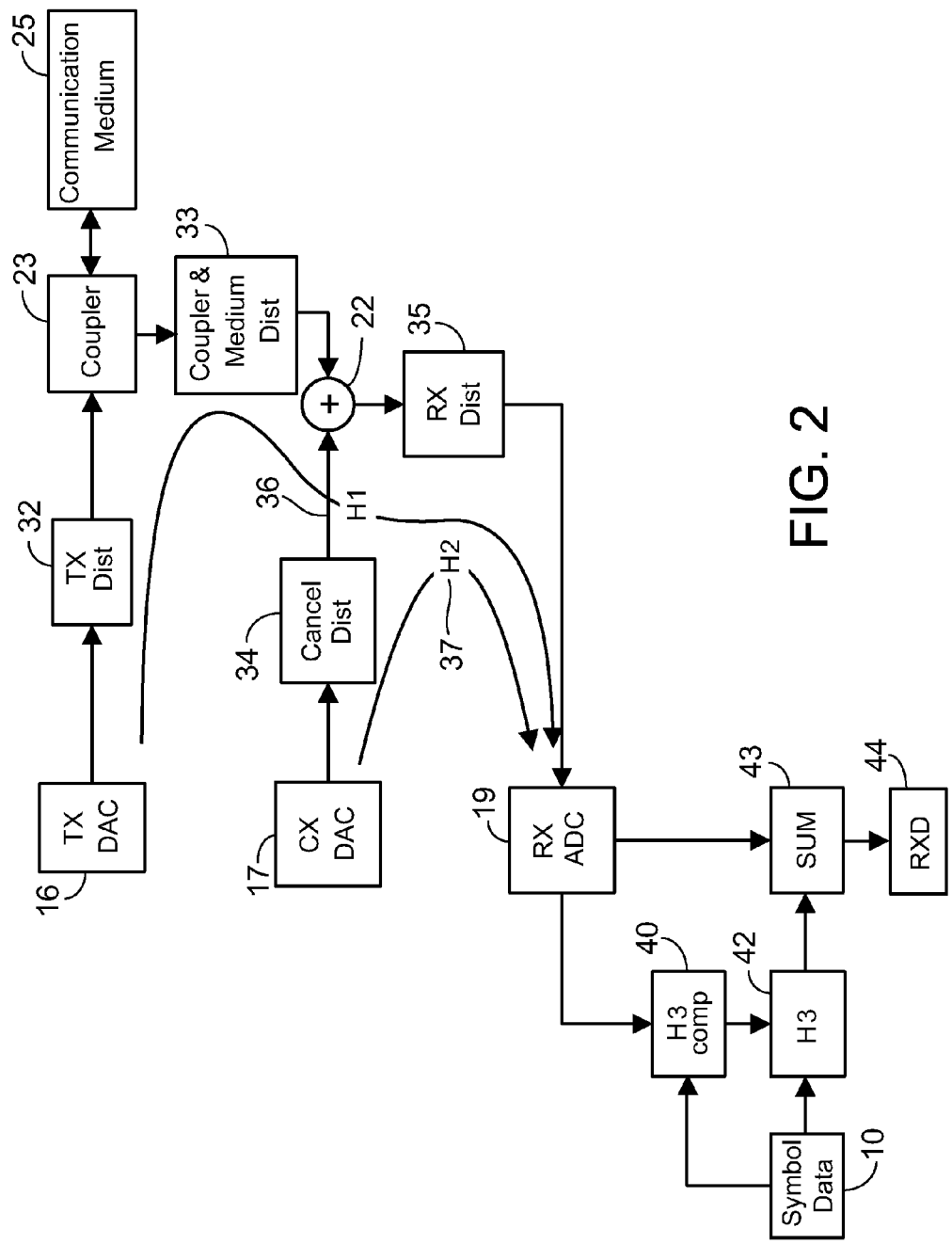
FIG. 2 is a block diagram showing signal paths and their associated distortions.

As the transmitted signal propagates from the TX DAC 16 to the RX ADC 19 along path H1 36, it experiences numerous linear and non-linear distortions. FIG. 2 shows a partial block diagram that depicts some representative distortions experienced by the signal that is transmitted from the TX DAC 16 as it propagates along propagation path H1 36 to the RX ADC 19, and some representative distortions 34 and 35 experienced by the cancellation signal transmitted from the CX DAC 17 as it follows path H2 37 to the RX ADC 19. Distortions caused by the TX AMP 20, CX AMP 21, and RX AMP 24 are represented by replacing those blocks with TX Dist block 32, Cancel Dist block 34 and RX Dist block 35, respectively. Distortions caused by the coupler 23 and communication medium 25 are represented as a single Coupler & Medium Dist block 33. These distortions are varied in their nature and may be caused by these or other parts of the system in different proportions. In the illustrated example, the major source of non-linear distortion for path H1 36 is generated by the transmit amplifier TX AMP 20 and the major source of non-linear distortion for path H2 37 is generated by the cancellation amplifier CX AMP 21. Additionally, in this example the major source of linear distortion for path H1 36 is most often due to the effects of the communication medium 25 as it is coupled via the coupler 23 to the signal path. In other words, a reflected version of the transmitted signal travels through the channel before entering the co-located receive port leading to a linear distortion that is caused by the channel.

Figure 4:
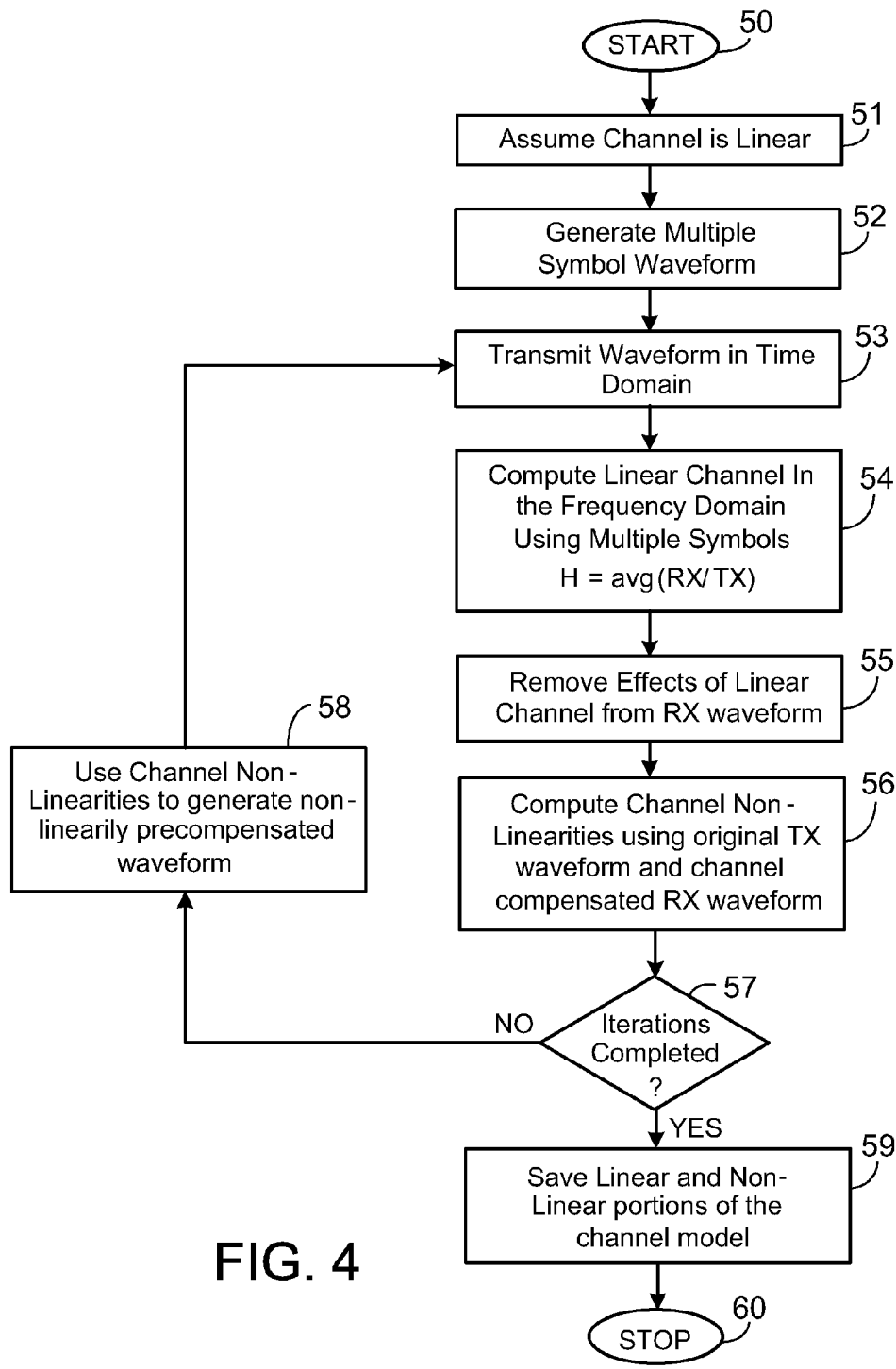
FIG. 4 is a flowchart of a process for computing estimates of the non-linear and linear channel characteristics of a signal path.
Figure 7:
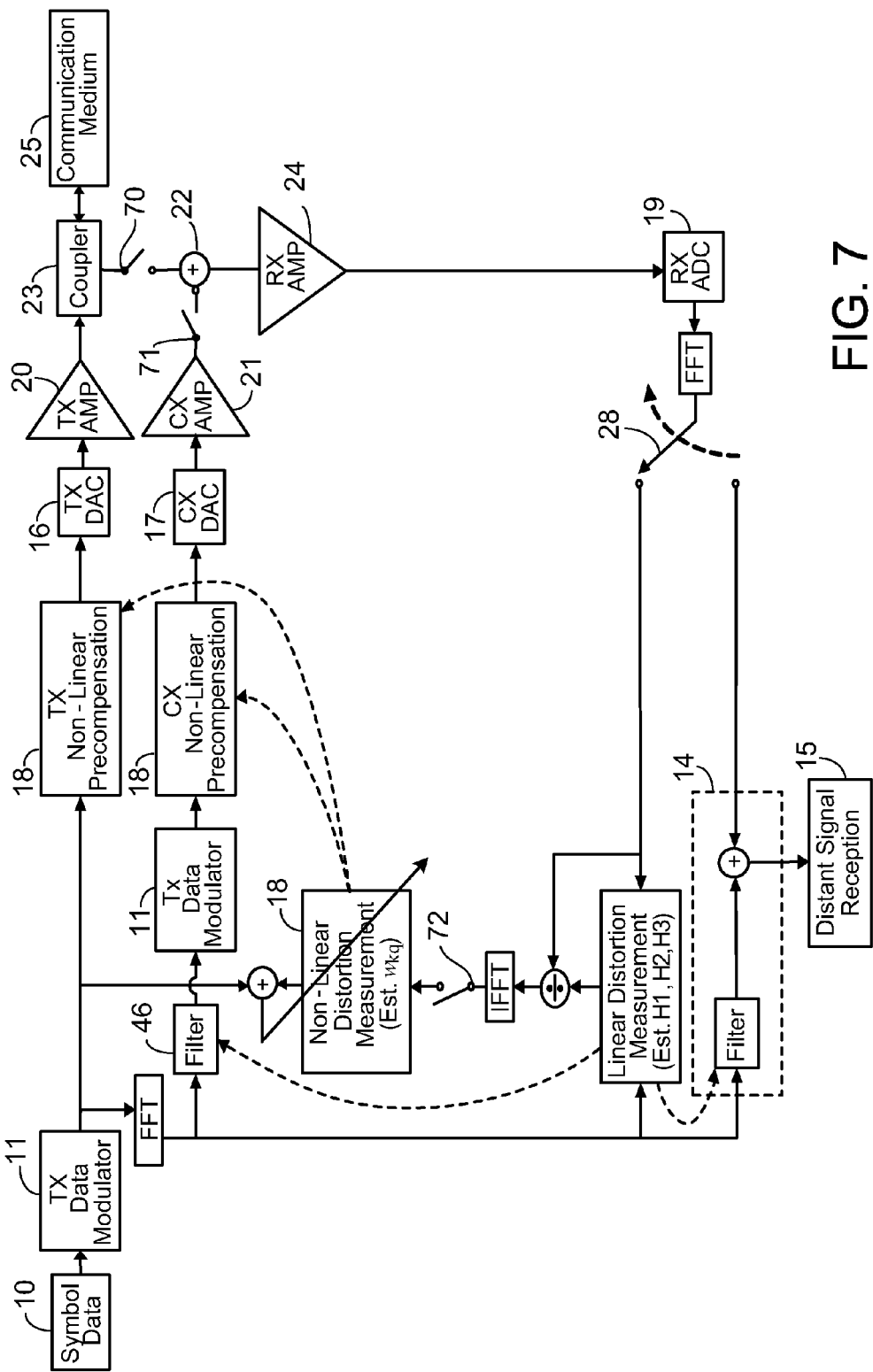
FIG. 7 is a detailed block diagram of a digital communication transceiver employing transmission suppression.

Accurate measurements of the linear and non-linear distortions in paths H1 36 and H2 37 can be attained by using the method described in the flowchart of FIG. 4. The training process for measuring the linear and non-linear distortion of path H1 36 will be used as an example. Similar techniques can also be employed to measure the distortion of path H2 37. Referring to FIG. 7, during the training phase, switch 28 remains in the up position connecting the Rx ADC 19 to the TX distortion measurement block 13. When the linear and non-linear distortions on path H1 are being measured, switches 70 and 72 are closed and switch 71 is open. When measuring distortions on path H2, switches 71 and 72 are closed and switch 70 is open. To start the measurement process the channel under measurement, in this case H1 36, is assumed to be completely linear 51, hence no non-linear pre-compensation is applied to the initial signal to be transmitted. First, a multi-symbol training waveform 52 is generated and transmitted 53 through path H1 36. Each symbol received at the RX ADC 19 is moved into the frequency domain and divided by the corresponding spectrum of the same symbol before it was transmitted (the undistorted spectrum of the original symbol). The quotient of this per-symbol division operation is then averaged over a sufficiently large number of symbols. The averaging process spreads the power of the noise and other uncorrelated signals and increased the accuracy of the linear channel distortion estimate 54. The estimate of the linear distortion 54 is then saved for later use.

Let $N_s$ OFDM symbols be used to estimate H1. Let $x_i$ represent the time-domain OFDM symbol 'i' at the output of the TX data modulator 11, and let $y_i$ represent the corresponding received symbol at the input of the RX ADC 19. Then, the computation of the channel's linear spectral transformation (distortion) described above can be written as follows:

$$H1 = (1/N_s) * \Sigma_i F_N(y_i)/F_N(x_i), i=1, 2, \ldots, N_s$$

After the linear channel distortion 54 has been computed, the effects of the linear channel are then removed from one or more of the received symbols 55 by dividing the spectral description of the received symbol by the estimated channel (H1).

$$z_i = F_N^{-1}(F_N(y_i)/H1)$$

Figure 5:
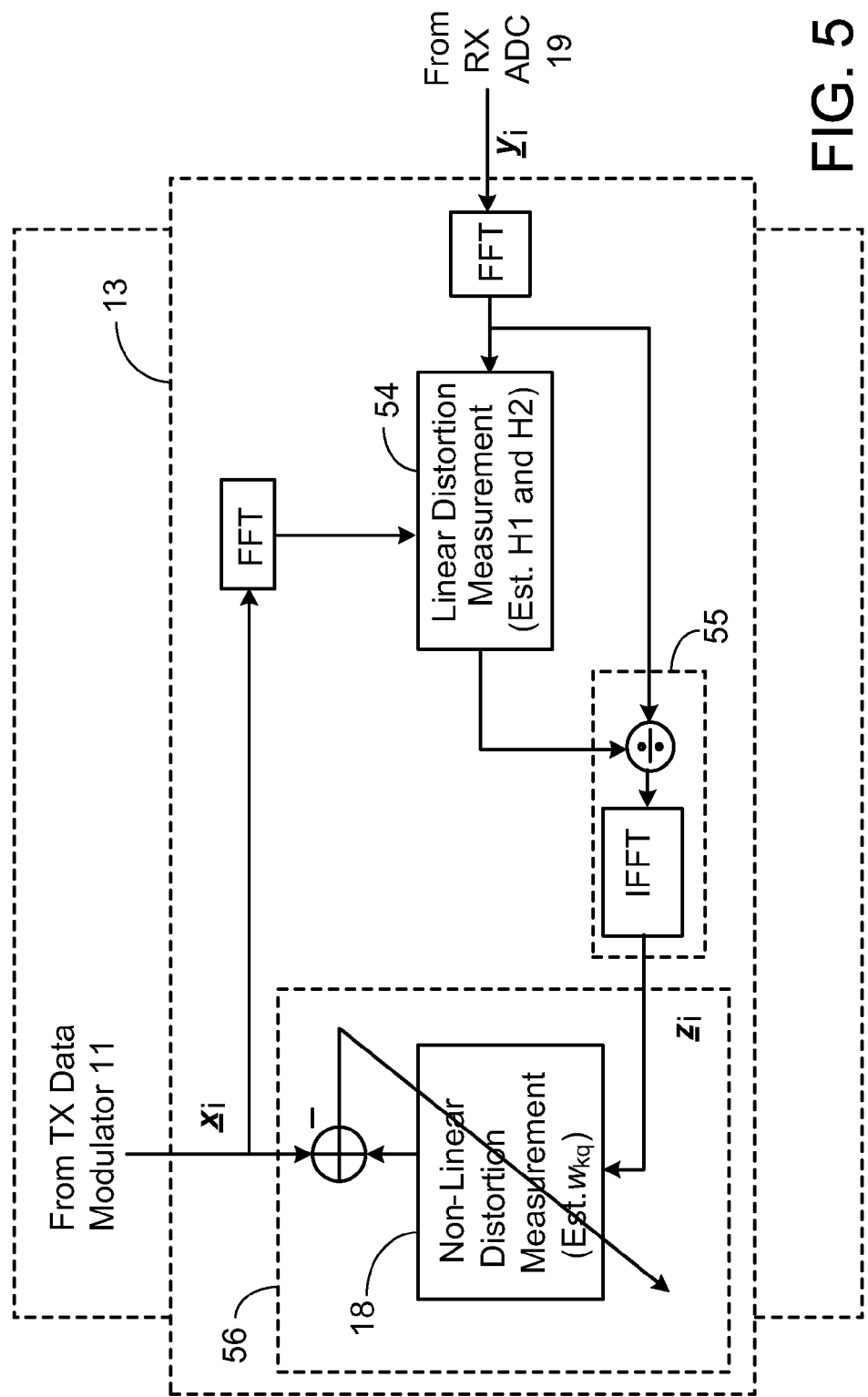
FIG. 5 is block diagram a TX distortion measurement block.

The linearly compensated RX symbol $z_i$ is then used to compute the inverse non-linearity 56 of the signal path being measured, which is, in this case, H1 36. Note that for signal path H1, $x_i$ is the input and $z_i$ represents the non-linear output (because the effect of the linear component of the channel has been removed in the computation of $z_i$). Thus, $$x_i = G(z_i),$$

where G represents the inverse non-linearity function. The two quantities $x_i$ and $z_i$ are used to adaptively estimate the inverse non-linearity function G. The procedure to estimate G is presented later. The operation of the TX distortion measurement block 13 as described in FIG. 4 is shown in more detail in FIG. 5. In this embodiment, an adaptive algorithm is used to estimate G in block 56.

A new multi-symbol calibration waveform is then generated as before. This waveform is then moved into the digital time domain where it is pre-compensated for the systems nonlinearities 58 using the inverse non-linearity function, G, estimated by the non-linear distortion measurement block 18. Suppose the calibration waveform consisted of a sequence of time-domain OFDM symbols $\{\alpha_i\}$, the pre-compensated transmit waveform is given by $\{G(\alpha_i)\}$.

The pre-compensated waveform is then transmitted 53 and received as before. The received linearized (pre-compensated) waveform is then used to compute a more accurate estimate of the linear channel characteristics 54. The new, more exact, linear channel estimate is then removed from the signal, and, as before, the resultant signal is used to estimate the non-linear channel characteristics 55 and 56, which can again be used to transmit another, more accurately pre-compensated 58 channel calibration waveform. This process is repeated until the accuracy of the linear and non-linear channel estimates are adequate for the application 57, at which point the linear and non-linear channel estimates are stored for later use 59 and the calibration process is stopped 60.

Measurement and Cancellation Process—Digital Loop

Due to imperfect measurements and imperfect device characteristics, the transmit power cancellation achieved at the analog summer 22 may be less than required for optimum performance. In order to further improve the removal of the transmitter's power from the received signal, digital cancellation loops can be implemented. These loops can include linear cancellation loops and/or non-linear cancellation loops.

FIG. 2 shows a representative digital linear cancellation loop. The remaining channel distortion H3 40 is computed by taking the spectrum of the OFDM symbol received at the RX ADC 19 and dividing it by the original symbol spectral data Symbol Data 10 which was used by the transmitter when generating the symbol now being received. This value is then averaged over a number of symbols to improve its accuracy and to spread the power of noise and interfering signals. The computed remaining linear cancellation distortion H3 42 is then multiplied by the negative of the original symbol's spectral data Symbol Data 10 yielding the inverse of the transmitted symbols remaining power. This cancellation spectral power is then added 43 to the spectrum of the received symbol, thereby further reducing the transmitted symbols power found in the received symbol data RXD 44. The process is very similar to the one used to estimate H1 and H2 as described above. Referring to FIG. 7, during the training phase for estimating H3, switch 28 is in the up position, switch 70 and 71 are closed, and switch 72 is open. Thus, the distortion measured by the TX distortion block 13 is the residual linear distortion (H3) after non-linearity pre-compensated transmission and analog transmit signal cancellation.

For additional system performance digital non-linear cancellation loops can also be implemented. This digital non-linear cancellation will work in conjunction with the digital linear cancellation loop much like the non-linear estimation and cancellation process described in FIG. 4 and explained in the analog cancellation section.

Note that switches 70, 71, 72, and 25 that are shown in FIG. 7 are only present to simplify exposition and to identify the path of signal-flows during different training and calibration modes of operation. Any implementation need not have any or all of these switches. These switches can be replaced with short-circuits and necessary paths can be turned on and off digitally.

Estimating the Inverse Non-Linearity Function

As mentioned earlier, training symbols are used to estimate the linear and non-linear components of the signal transmission path. Let $x_i$ be a transmitted OFDM symbol, and $z_i$ be the corresponding non-linear component at the output of the transmission path. In other words, $z_i$ is the received symbol from which the effects of the linear channel has been removed in block 55. It has been said before that the relationship between $x_i$ and $z_i$ can be expressed as $x_i = G(z_i)$, where G represents the non-linear component of the transmission path.

The inverse non-linearity is modeled using memory polynomials (also known as non-linear tapped delay lines). Thus, the relationship between $x_i$ and $z_i$ explicitly be expressed as $$x_i(n) = \Sigma_k \Sigma_q w_{kq} z_i(n-q) |z_i(n-q)|^{k-1}, q=0, 2, \ldots, Q-1,$$
$$\text{and } k \subset \{1, 2, 3, \ldots\}.$$

Figure 6:
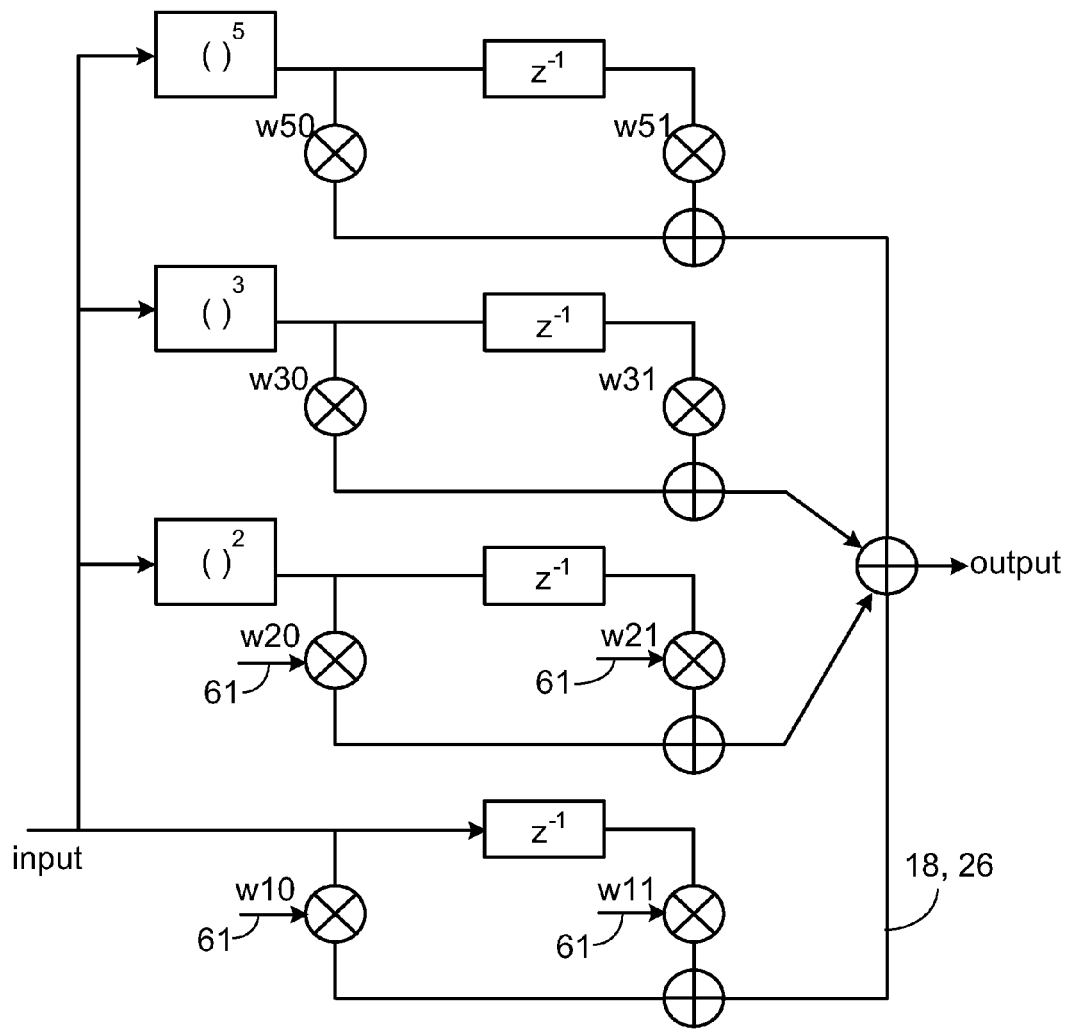
FIG. 6 is schematic of a memory-polynomial based pre-distorter used for non-linearity compensation.

In the above equation, k is the set of harmonics that we are trying to suppress, and Q−1 is the memory of the system. FIG. 6 illustrates the memory polynomial model of the non-linearity with Q=2 and k={1, 2, 3, 5}. During the training process, $x_i$ and $z_i$ are used to compute the weights $w_{kq}$ 61. The weights are obtained using a gradient descent algorithm like the LMS (least-mean-squares) algorithm. In one embodiment of the algorithm that uses LMS, the weights are obtained in an iterative manner as follows:

$$w_{kq}(n+1) = w_{kq}(n) + \mu_k z_i(n-q) |z_i(n-q)|^{k-1} (x_i(n) - \Sigma_k \Sigma_k w_{kq}(n)_{kq}(n) z_i(n-q) |z_i(n-q)|^{k-1}),$$

where $\mu_k$ represents the step size that is used to adapt the coefficients corresponding to the kth harmonic viz., $w_{kq}$, q=0, 2, . . . , Q−1.

In one embodiment of the algorithm, every harmonic branch uses a different step size for faster convergence. Once the weights $w_{kq}$ are determined, the inverse non-linearity function is fully defined, and it can be used for non-linear pre-compensation on the transmit path.

Figure 8:
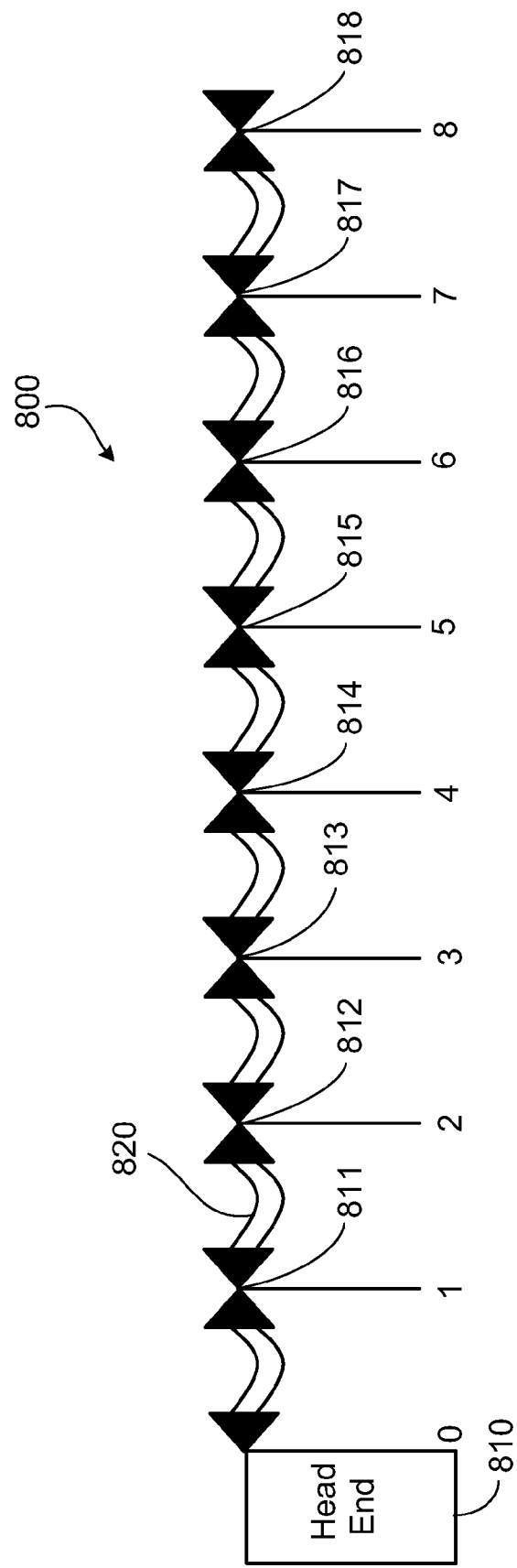
FIG. 8 is a schematic diagram of a transmission line with repeaters.

A transceiver employing the transmission suppression method described above may be used by a communication signal repeater to reduce forwarding delay and enhance network throughput. An exemplary repeater application in a PLC network is depicted in FIG. 8. The PLC network 800 includes a head end 810 and several stations (e.g. 811, 812, 813, 814, 815, 816, 817, and 818) operating repeaters and positioned on poles spaced along the power line 820 such that only adjacent stations are within reception range of each other. The repeaters include transceivers with the transmission suppression capabilities described above. In the example scenario the head end 810 has data to transmit to station 815. Head end 810 first partitions the data into one or more CSMA-CA frames and sets the destination field for the frame or frames to the address for station 815. Head end 810 may also set the value of a control field in the frame header to indicate that immediate forwarding is enabled.

When head end 810 detects that the medium is idle, it transmits the first frame on the power line 820 using a PHY layer protocol such as, for example, OFDM. The repeater at station 811 begins reception of the frame and checks the destination address. Because station 811 is not the destination and the immediate forwarding is enabled, the repeater begins copying the incoming frame and commences retransmission of the frame before reception of the frame is complete. As it retransmits the frame, station 811 may clear the immediate forwarding control field to indicate that immediate forwarding for the next hop is disabled. Head end 810 is still transmitting the first frame and ignores the retransmission. Station 812 then begins reception of the retransmitted frame and engages its own repeater. Because the immediate forwarding is disabled, station 812 stores the frame until reception is complete and then commences retransmission of the frame. As it retransmits the frame, station 812 may set the immediate forwarding control field to indicate that immediate forwarding for the next hop is enabled. This process of reception and retransmission continues at each repeater 813 and 814 down the power line 820 until station 815 receives the retransmission of the frame from the repeater at station 814. Station 815 checks the destination address for the frame and determines that it is the final destination of the frame. Thus station 815 does not retransmit the frame, completes reception and decode of the frame so the payload may be passed up for higher network layer stack processing at station 815.

After head end 810 completes transmission of the first frame it will wait a length of time sufficient allow retransmission of the first frame by a non-adjacent station, in this case station 812, or until an acknowledgment for the first frame is received. Head end 810 will then attempt to contend for the medium 820 in order to transmit the next remaining frame if any. The entire process will be repeated until all frames have been sent from head end 810 and received by destination station 815.

The amount of time the head end 810 must wait after completion of its transmission of the first frame to start transmission of the next frame is reduced compared to a system that stores the entire frame before commencing retransmission from the repeater at station 811, because a substantial portion of the frame may be retransmitted prior to completion of the first transmission. Thus head end 810 is able to transmit a sequence of frames faster and a higher network throughput is achieved by reusing the bandwidth on the medium 820 for simultaneous forwarding. The system may also achieve a higher data rate than a comparable system using non-overlapping frequency bands for the transmission and retransmission of a forwarded frame, because more of the usable bandwidth on the medium 820 may be used for each transmission.

Repeaters employing transmission suppression may reuse bandwidth used by an incoming transmission for concurrent retransmission as long as the destination node (e.g. the next repeater in the repeater chain or the ultimate destination node) is sufficiently remote from the source node (e.g. the previous repeater in the chain or the ultimate source node). If the source node is sufficiently remote from the destination node then interference from the incoming transmission will be small enough to allow reliable reception of the retransmission at the destination node. In this manner forwarding delay is reduced relative to a store and forward repeater scheme while data rates and network throughput may be kept high by efficiently reusing some or all available bandwidth on the medium.

Any processes described herein and their various modifications (hereinafter "the processes"), are not limited to the hardware and software described above. All or part of the processes can be implemented, at least in part, via a computer program product, e.g., a computer program tangibly embodied in an information carrier, such as one or more machine-readable media or a propagated signal, for execution by, or to control the operation of, one or more data processing apparatus, e.g., a programmable processor, a computer, multiple computers, and/or programmable logic components.

A computer program can be written in any form of programming language, including compiled or interpreted languages, and it can be deployed in any form, including as a stand-alone program or as a module, component, subroutine, or other unit suitable for use in a computing environment.

Actions associated with implementing all or part of the processes can be performed by one or more programmable processors executing one or more computer programs to perform the functions of the calibration process. All or part of the processes can be implemented as, special purpose logic circuitry, e.g., an FPGA (field programmable gate array) and/or an ASIC (application-specific integrated circuit).

Processors suitable for the execution of a computer program include, by way of example, both general and special purpose microprocessors, and any one or more processors of any kind of digital computer. Generally, a processor will receive instructions and data from a read-only memory or a random access memory or both. Components of a computer include a processor for executing instructions and one or more memory devices for storing instructions and data.

Components of different embodiments described herein may be combined to form other embodiments not specifically set forth above. Other embodiments not specifically described herein are also within the scope of the following claims.

What is claimed is:

1. An apparatus comprising:
   a first modulator configured to convert symbol data to a transmission waveform;
   a first non-linear filter configured to modify the transmission waveform to at least partially compensate for non-linear distortions of a transmission signal path that includes a first medium coupling device and a second medium coupling device;
   the first medium coupling device for coupling transmitted signals to a communication medium, the transmitted signals based upon the modified transmission waveform;
   the second medium coupling device for coupling detected signals from the communication medium;
   cancellation circuitry configured to convert the symbol data to a cancellation waveform that is substantially 180 degrees out of phase with the transmission waveform; and
   summing circuitry configured to combine the cancellation waveform with the detected signals such that the transmitted signals are at least partially cancelled from the detected signals to determine a received signal.

2. The apparatus of claim 1, wherein the first non-linear filter is cascaded after the first modulator and the first medium coupling device is cascaded after the first non-linear filter.

3. The apparatus of claim 1, wherein the transmission waveform is a digitally encoded waveform.

4. The apparatus of claim 1, further comprising a first digital to analog converter cascaded after the first non-linear filter.

5. The apparatus of claim 4 further comprising an analog amplifier cascaded after the first digital to analog converter.

6. The apparatus of claim 1, further comprising an analog amplifier with an automatic gain control circuit cascaded after an output of the summing circuitry.

7. The apparatus of claim 6, further comprising:
   an analog to digital converter cascaded after the analog amplifier;
   a digital filter configured to convert the symbol data to a digitally encoded waveform that is substantially 180 degrees out of phase with a residual signal encoding the symbol data on an output of the analog to digital converter; and
   a digital summer configured to add an output of the digital filter to the output of the analog to digital converter.

8. The apparatus of claim 1, wherein the cancellation circuitry comprises a second non-linear filter configured to modify the cancellation waveform to at least partially pre-compensate for non-linear distortions of the cancellation circuitry.

9. The apparatus of claim 1, wherein the first non-linear filter is a memory polynomial filter.

10. The apparatus of claim 1, wherein the communication medium is a power line.

11. The apparatus of claim 10, wherein the first non-linear filter has a plurality of sets of coefficients, wherein each set of coefficients is associated with a different phase of the power cycle on the power line and each set of coefficients is adapted independently of other sets of coefficients.

12. The apparatus of claim 1, wherein the first modulator is an orthogonal frequency division multiplexing modulator.

13. The apparatus of claim 1, further comprising:
   an analog amplifier cascaded after the summing circuitry;
   an analog to digital converter cascaded after the analog amplifier; and
   a signal path estimation block configured to estimate non-linear distortions in the transmission signal path and linear distortion in the transmission signal path based on comparing an output of the analog to digital converter and the symbol data.

14. The apparatus of claim 13, wherein the signal path estimation block is configured to estimate the linear distortion first and use the linear distortion estimate to estimate the non-linear distortion.

15. The apparatus of claim 14, wherein the non-linear distortion estimate from the signal path estimation block is used to configure the first non-linear filter and the estimation process is repeated with a subsequent symbol of the symbol data.

16. The apparatus of claim 1, wherein the first medium coupling device and the second medium coupling device share one or more common components.

17. A method comprising:
   filtering a transmission waveform with a non-linear filter to at least partially pre-compensate for nonlinear distortion in a transmission signal path to generate a pre-compensated transmission signal, the transmission signal path including a co-located receiver coupled to a communication medium;
   coupling the pre-compensated transmission signal to the communication medium;
   receiving, at the co-located receiver from the communication medium, an analog detected signal that includes the pre-compensated transmission signal;
   filtering the transmission waveform to generate an analog cancellation signal that is substantially 180 degrees out of phase with the transmission waveform; and
   adding the analog cancellation signal to the analog detected signal, such that the pre-compensated transmission signal is at least partially cancelled from the analog detected signal to determine an analog received signal.

18. The method of claim 17, wherein the non-linear filter is a digital filter.

19. The method of claim 18, further comprising converting the pre-compensated transmission signal to an analog transmission signal.

20. The method of claim 17, further comprising:
   converting the analog received signal resulting from analog cancellation to a digital received signal;
   filtering the transmission waveform to output a digital cancellation signal that is substantially 180 degrees out of phase with a residual component of the digital received signal that is caused by the transmission waveform; and
   adding the digital cancellation signal to the digital received signal.

21. The method of claim 17, wherein filtering the transmission waveform to generate an analog cancellation signal comprises filtering with a non-linear filter configured to substantially pre-compensate for non-linear distortions of a cancellation signal path.

22. The method of claim 17, wherein the non-linear filter is a memory polynomial filter.

23. The method of claim 17, wherein the communication medium is a power line.

24. The method of claim 17, wherein the pre-compensated transmission signal is an orthogonal frequency division multiplexing signal.

25. The method of claim 17, wherein the communication medium is a coaxial cable.

26. The method of claim 17, wherein the communication medium is a twisted pair cable.

27. The method of claim 17, wherein an estimate of an impulse response of a further signal path including the communication medium is used to filter the transmission waveform to generate an analog cancellation signal.

28. A method comprising:
transmitting a plurality of orthogonal frequency division multiplexing symbols via a transmitter coupled to a communication medium;
receiving the symbols at a co-located receiver coupled to the communication medium;
applying a discrete Fourier transform to each of the received symbols to compute a first frequency domain representation of the received symbols;
dividing the first frequency domain representation of each of the received symbols by a second frequency domain representation for each corresponding transmitted symbol;
averaging quotients from said dividing over all the symbols to estimate a linear distortion associated with a first signal path that includes the transmitter and the co-located receiver;
dividing the first frequency domain representation of each of the received symbols by the estimated linear distortion and applying an inverse discrete Fourier transform to produce linear distortion compensated received symbols; and
estimating a non-linear distortion in the first signal path based on the transmitted symbols and the linear distortion compensated received symbols.

29. The method of claim 28, further comprising:
configuring a non-linear filter to pre-compensate for non-linear distortions in the first signal path based on the estimate of the non-linear distortion in the first signal path;
applying the non-linear filter to a plurality of pre-compensated symbols; and
repeating the transmitting,
estimating steps described in claim 28, using the pre-compensated symbols.

30. The method of claim 28, further comprising:
calculating a change in the linear and non-linear distortion estimates between a first iteration and a subsequent iteration; and
repeating the configuring, applying, and repeating steps of claim 29 until the change in the linear and non-linear distortion estimates is below a threshold, at which point the linear and non-linear distortion estimates are stored.

31. The method of claim 28, wherein the non-linear distortion on the first signal path is modeled as a memory polynomial for estimation.

32. The method of claim 31, wherein coefficient estimates for the memory polynomial are calculated using a gradient descent algorithm.

33. The method of claim 32, wherein the gradient descent algorithm uses different adaptation step sizes for each harmonic branch of the memory polynomial.

34. The method of claim 33, wherein the gradient descent algorithm uses smaller step sizes for higher harmonic branches of the memory polynomial.

35. The method of claim 28, further comprising:
passing a plurality of orthogonal frequency division multiplexing symbols through a second signal path that includes a cancellation path to an analog summer in the co-located receiver;
repeating the estimation process described in claim 28 to estimate further linear and non-linear distortions associated with the second signal path.

36. A method comprising:
transmitting a first multi-carrier signal modulated by transmitted data on a communication medium; and
recovering a second multi-carrier signal associated with received data from the communication medium, wherein the first multi-carrier signal and the second multi-carrier signal at least partially overlap in both frequency and time,
wherein recovering the second multi-carrier signal comprises adding a cancellation signal to a detected signal detected from the communication medium to suppress the first multi-carrier signal from the detected signal and to facilitate recovery of the second multi-carrier signal from the detected signal.

37. The method of claim 36, wherein recovering the second multi-carrier signal comprises calculating the cancellation signal to be substantially 180 degrees out of phase with a component of the detected signal that is caused by transmitting the first multi-carrier signal on the communication medium.

38. The method of claim 36, wherein the communication medium is a power line.

39. The method of claim 36, wherein the communication medium is a coaxial cable.

40. The method of claim 36, wherein the communication medium is a twisted pair cable.

41. The method of claim 36, wherein an estimate of an impulse response of a signal path including the communication medium is used to generate an analog cancellation signal based upon symbol data associated with the transmitted first multi-carrier signal and the estimated impulse response.

42. The method of claim 36, wherein the first and second multi-carrier signals are orthogonal frequency division multiplexed signals.

43. The method of claim 36, wherein a first set of carrier frequencies modulated by data in the first multi-carrier signal and a second set of carrier frequencies modulated by data in the second multi-carrier signal intersect.

44. The method of claim 36, wherein the first multi-carrier signal and the second multi-carrier signal are synchronized.

45. The method of claim 36, wherein symbol boundaries of the first multi-carrier signal and the second multi-carrier signal are aligned in time on the communication medium.

46. The method of claim 36, wherein the first multi-carrier signal and the second multi-carrier signal are synchronized so that symbol boundaries are aligned in time on the communication medium.

47. The method of claim 36, wherein the first and second multi-carrier signals are broadband signals.

48. The method of claim 36, wherein the first multi-carrier signal encodes data from a frame that is still being received from the second multi-carrier signal.

49. An apparatus comprising:
a modulator configured to convert a symbol to a digitally encoded waveform;
a non-linear filter, configured to substantially pre-compensate for non-linear distortions of a transmission signal path, cascaded after the modulator;
a digital to analog converter cascaded after the non-linear filter;
an analog amplifier cascaded after the digital to analog converter;
a medium coupling device cascaded after the analog amplifier;

a receiver cascaded after the medium coupling device, the receiver configured to receive a detected signal appearing on a medium coupled to the medium coupling device;

a cancellation device configured to substantially cancel a representation of the symbol in the detected signal to determine a cancelled signal; and an adaptation block configured to calculate new values for coefficients of the non-linear filter based in part on the cancelled signal.

50. The apparatus of claim 49, wherein the cancellation device comprises an analog summing circuit configured to add a cancellation signal to the detected signal.

51. The apparatus of claim 49, wherein the non-linear filter is a memory polynomial filter.

52. The apparatus of claim 49, wherein the medium coupling device is coupled to a power line and couples signals to and from the power line.

53. The apparatus of claim 49, wherein the medium coupling device is coupled to a coaxial cable and couples signals to and from the coaxial cable.

54. The apparatus of claim 49, wherein the medium coupling device is coupled to a twisted pair cable and couples signals to and from the twisted pair cable.

55. The apparatus of claim 52, wherein the non-linear filter has a plurality of sets of coefficients, wherein each set of coefficients is associated with a different phase of a power cycle on the power line and each set of coefficients is adapted independently of other sets of coefficients.

56. The apparatus of claim 49, wherein the modulator is an orthogonal frequency division multiplexing modulator.

57. An apparatus comprising:
a transmitter configured to modulate a first multi-carrier signal and couple the first multi-carrier signal to a communication medium;
a receiver configured to couple detected signals from the communication medium, the detected signals including a second multi-carrier signal, wherein the first multi-carrier signal and the second multi-carrier signal at least partially overlap in both frequency and time; and
a processing device coupled with both the transmitter and the receiver and configured to calculate a cancellation signal and add the cancellation signal to detected signals coupled from the communication medium by the receiver to suppress the first multi-carrier signal from the detected signals and to facilitate recovery of the second multi-carrier signal from the detected signals.

58. The apparatus of claim 57, wherein the cancellation signal is substantially 180 degrees out of phase with a component of the detected signals that is caused by the transmitter modulating the first multi-carrier signal on the communication medium.

59. The apparatus of claim 57, wherein the communication medium is a power line.

60. The apparatus of claim 57, wherein the communication medium is a coaxial cable.

61. The apparatus of claim 57, wherein the communication medium is a twisted pair cable.

62. The apparatus of claim 57, wherein the processing device is configured to calculate an estimate of an impulse response of a signal path including the communication medium that is used to generate the cancellation signal based upon symbol data associated with the modulated first multi-carrier signal and the estimated impulse response.

63. The apparatus of claim 57, wherein the cancellation signal is analog and the receiver comprises an analog summer circuit that is used to add the cancellation signal to the detected signals coupled from the communication medium.

64. The apparatus of claim 57, wherein the first and second multi-carrier signals are orthogonal frequency division multiplexed signals.

65. The apparatus of claim 57, wherein a first set of carrier frequencies modulated by data in the first multi-carrier signal and a second set of carrier frequencies modulated by data in the second multi-carrier signal intersect.

66. The apparatus of claim 57, wherein the first multi-carrier signal and the second multi-carrier signal are synchronized.

67. The method of claim 57, wherein symbol boundaries of the first multi-carrier signal and the second multi-carrier signal are aligned in time at the communication medium.

68. The apparatus of claim 57, wherein the first multi-carrier signal and the second multi-carrier signal are synchronized so that symbol boundaries are aligned in time at the communication medium.

69. The apparatus of claim 57, wherein the first and second multi-carrier signals are broadband signals.

70. The apparatus of claim 57, wherein the transmitter comprises a non-linear filter configured to at least partially compensate for non-linear distortions of a transmission signal path that includes the transmitter and the receiver.

71. The apparatus of claim 70, wherein the processing device is configured to calculate coefficients for the non-linear filter based at least in part on signals coupled from the communication medium by the receiver.

72. The apparatus of claim 63, wherein the receiver further comprises an analog to digital converter cascaded after the analog summer circuit, and the processing device is further configured to calculate a second cancellation signal that is digital and add the second cancellation signal to digital signals from the analog to digital converter.

73. The apparatus of claim 72, the second cancellation signal is substantially 180 degrees out of phase with a residual component of the detected signals coupled from the communication medium that is caused by the transmitter modulating the first multi-carrier signal on the communication medium, the residual component remaining despite addition of the second cancellation signal to the detected signals.

74. The method of claim 57, wherein the first multi-carrier signal encodes data from a frame that has been partially demodulated and is still being demodulated by the receiver from the second multi-carrier signal.

75. An apparatus comprising:
a means for transmitting a first multi-carrier signal on a communication medium; and
a means for recovering a second multi-carrier signal from the communication medium, wherein the first multi-carrier signal and the second multi-carrier signal at least partially overlap in both frequency and time,
wherein recovering the second multi-carrier signal comprises adding a cancellation signal to a detected signal detected from the communication medium to suppress the first multi-carrier signal from the detected signal and to facilitate recovery of the second multi-carrier signal from the detected signal.

* * * * *